United States Patent [19]

Nakagawara

[11] Patent Number: 5,532,644
[45] Date of Patent: Jul. 2, 1996

[54] VARIABLE GAIN AMPLIFYING CIRCUIT

[75] Inventor: Chikashi Nakagawara, Yokohama, Japan

[73] Assignee: Kabushiki Kaisha Toshiba, Kanagawa-ken, Japan

[21] Appl. No.: 393,278

[22] Filed: Feb. 23, 1995

[30] Foreign Application Priority Data

Feb. 24, 1994 [JP] Japan .................................. 6-026771

[51] Int. Cl.$^6$ ...................................................... H03F 3/45
[52] U.S. Cl. .............................................. 330/254; 330/252
[58] Field of Search ..................................... 330/252, 254

[56] References Cited

U.S. PATENT DOCUMENTS

| | | |
|---|---|---|
| 4,216,436 | 8/1980 | Lefferts . |
| 5,091,701 | 2/1992 | Butler .................................. 330/252 |

FOREIGN PATENT DOCUMENTS

| | | | |
|---|---|---|---|
| 2619972 | 3/1989 | France | .................. 330/252 |
| 62605 | 3/1987 | Japan | .................. 330/252 |
| 62-76911 | 4/1987 | Japan . | |
| 4-61408 | 2/1992 | Japan . | |

OTHER PUBLICATIONS

"Precision Differential Voltage–Current Convertor", Raimondo Caprio, Electronics Letters, 9(6):147–148 (1973) (No Month).

*Primary Examiner*—James B. Mullins
*Attorney, Agent, or Firm*—Finnegan, Henderson, Farabow, Garrett & Dunner

[57] ABSTRACT

A variable gain amplifying circuit is disclosed, which comprises a first transistor pair whose bases are connected to input terminals, a PN junction pair with bias currents that are collector currents of the first transistor pair, a second transistor pair with a common emitter that is a base input of a voltage difference of the PN junction pair, the common emitter having a current source, and a third transistor pair whose collectors are connected to corresponding emitters of the first transistor pair, whose bases are connected to the corresponding collectors, whose emitter are connected through a resistor, and whose emitters are connected to a current source for supplying bias currents, wherein outputs are obtained from the collector of the second transistor pair.

14 Claims, 5 Drawing Sheets

VARIABLE GAIN AMPLIFYING CIRCUIT

BACKGROUND OF THE INVENTION

1. Field of the invention

The present invention relates to a variable gain amplifying circuit for use with an amplification for amplifying a signal amplitude level.

2. Description of the Related Art

As a conventional variable gain amplifying circuit, a so-called Gilbert gain cell circuit as shown in FIG. 8 is known. In FIG. 8, signals are input to bases of a first transistor pair 1. Emitters of the first transistor pair 1 are connected to respective current sources 20 and 21. The emitters of the first transistor pair i are connected through a resistor 30. Collector currents of the first transistor pair 1 are used as bias currents of a first diode pair 11. The anodes of the first diode pair 11 are connected to a bias voltage source. Cathode voltages of the first diode pair 11 are applied to bases of a second transistor pair 2. Emitters of the second transistor pair 2 are connected as a common emitter to a current source 22. Current outputs are obtained from collectors of the second transistor pair 2.

In such a construction, the transconductance gain G between the input and the output is given by the following equation.

$$G = I2/(Re/2 + re) \, I1 \tag{1}$$

where Re is the resistance of the resistor 30; and I1 and I2 are current values of the current sources 20 and 21, respectively.

In addition, the following equation is given.

$$re = q \times I1/kT \tag{2}$$

where re is the emitter differential resistance of the first transistor pair 1; k is the Boltzmann constant; q is the charge amount of electrons; and T is the absolute temperature.

Since either the current value I1 or the resistance value Re increases, re can be ignored. Thus, the equation (1) can be represented by the following equation (3).

$$G = (2/Re) \, I2/I1 \tag{3}$$

Consequently, when the ratio between the current values I1 and I2 is varied corresponding to the equation (3), the gain G can be freely changed. In addition, the emitter differential resistance re, which is a non-linear element, is omitted, it is clear that the linear characteristics of the input and output are good.

However, to remove the influence of re, it is necessary to increase the current value I1. This current increase prevents the circuit from being fabricated with an IC. If the resistance value Re is increased, the gain G decreases. To prevent the gain G from decreasing, the current value I2 should be increased, thereby preventing the circuit from being fabricated with an IC. Thus, the influence of re cannot be ignored. In other words, the linear characteristics of the input and output cannot be improved.

To solve such a problem, a circuit shown in FIG. 9 is known. In FIG. 9, the bases of the transistors of the first transistor pair 1 shown in FIG. 8 are connected to output terminals of operational amplifiers 40 and 41, respectively. Inverted input terminals of the operational amplifiers 40 and 41 are connected to the emitters of the transistors of the first transistor pair 1. Input signals are supplied to noninverted input terminals of the operational amplifiers 40 and 41.

Thus, a feed-back loop is constructed. An emitter differential resistance re of each transistor of the first transistor pair 1 is a inverce of the gain of each of the operational amplifiers 40 and 41.

Thus, when the gains of the operational amplifiers 40 and 41 are remarkably high, the influence of re can be ignored. The current value I1 and the resistance value Re should have an input dynamic range corresponding to the amplitude of the input signal. Consequently, since the current value I1 and the resistance value Re are decreased, the current consumption can be suppressed. As a result, the problem for fabricating the circuit with an IC can be solved.

However, since the frequency characteristics of the operational amplifiers are bad, the circuit shown in FIG. 9 cannot handle signals having relatively high frequencies. Thus, the applications of the circuit shown in FIG. 9 are limited.

SUMMARY OF THE INVENTION

An object of the present invention is to provide a variable gain amplifying circuit that has less deterioration of frequency characteristics and high linear characteristics of input signal and output signal and that can be suitably fabricated with an IC.

A first aspect of the present invention is a variable gain amplifying circuit, comprising a first transistor pair whose bases are connected to input terminals, a PN junction pair with bias currents that are collector currents of the first transistor pair, a second transistor pair with a common emitter that is a base input of a voltage difference of the PN junction pair, the common emitter having a current means, and a third transistor pair whose collectors are connected to corresponding emitters of said first transistor pair, whose bases are connected to the corresponding collectors, whose emitter are connected through a resistor, and whose emitters are connected to a current supply means for supplying bias currents, wherein outputs are obtained from the collector of the second transistor pair.

A second aspect of the present invention is a variable gain amplifying circuit, comprising a first transistor pair whose bases are connected to corresponding collectors and whose emitters are connected to respective current supply means for supplying bias currents, a PN junction pair with bias currents that are collector currents of the first transistor pair, a second transistor pair with a common emitter that is a base input of a voltage difference of the PN junction pair, the common emitter having a current source, and an input voltage means connected to the emitters of the first transistor pair through a resistor, wherein outputs are obtained from the collector of the second transistor pair.

In the above-described variable gain amplifying circuit, the influence of the emitter differential resistance can be removed regardless of the amount of the bias current. Thus, the increase of the current consumption can be reduced and the linear characteristics of the input signal and output signal can be improved. Consequently, the operational amplifiers can be omitted. In addition, the frequency characteristics are less deteriorated and relatively high frequencies can be handled. Moreover, the circuit can be operated at a low voltage.

These and other objects, features and advantages of the present invention will become more apparent in light of the

DESCRIPTION OF THE PREFERRED EMBODIMENTS

Next, with reference to the accompanying drawings, embodiments of the present invention will be described.

Figure 1:
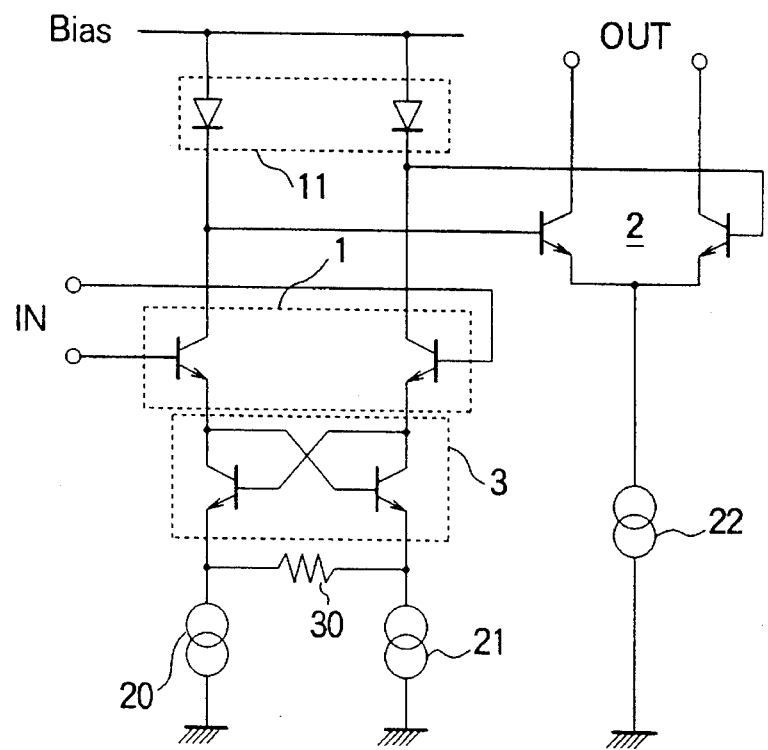
FIG. 1 is a circuit diagram for explaining a variable gain amplifying circuit according to an embodiment of the present invention.
Figure 8:
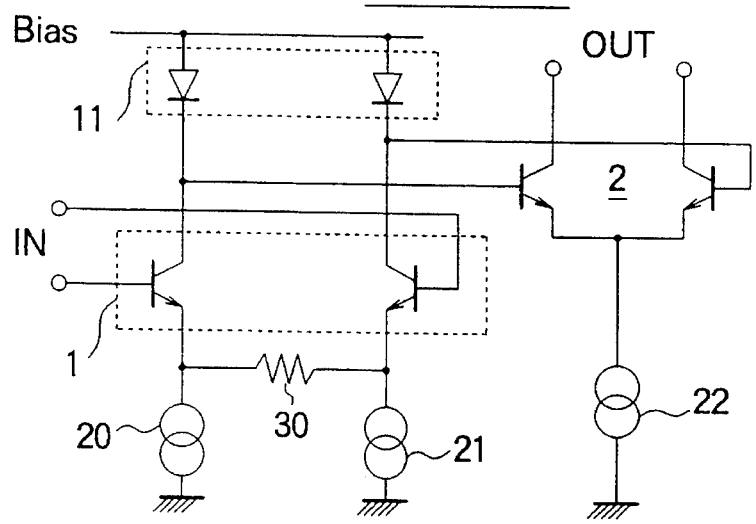
FIG. 8 is a circuit diagram for explaining a conventional variable gain amplifying circuit.
Figure 9:
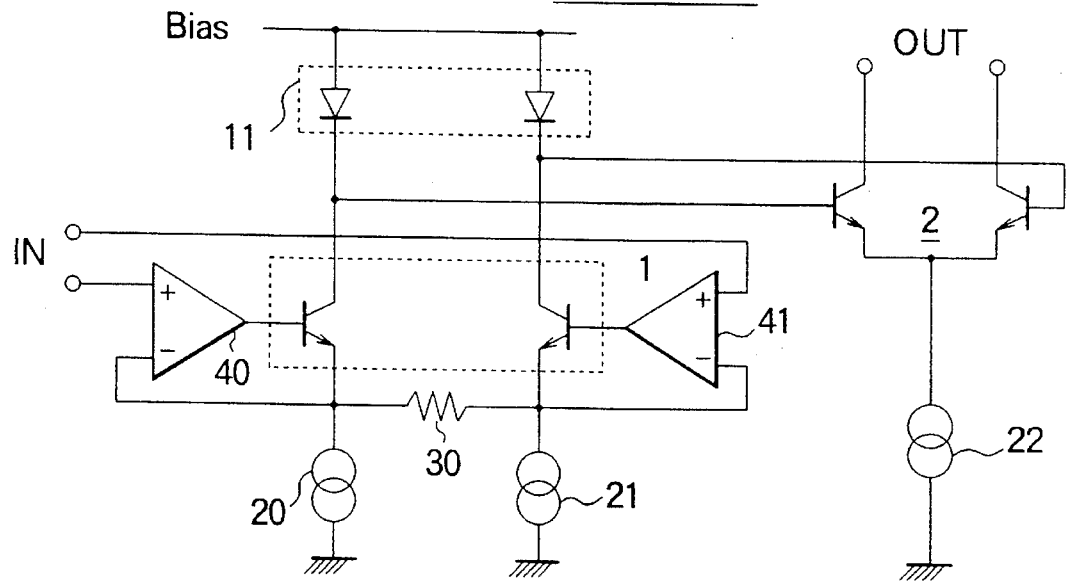
FIG. 9 is a circuit diagram for explaining another conventional variable gain amplifying circuit.

FIG. 1 is a circuit diagram for explaining a first embodiment of the present invention. The difference point between this embodiment and the related art reference shown in FIG. 8 is in that a third transistor pair 3 is disposed between the emitters of the first transistor pair 1 and the connected points of the resistor 30 and the current sources 20 and 21. The bases of the third transistor pair are connected to the corresponding collectors thereof.

In this circuit construction, the emitter differential resistance re of the first transistor pair 1 is cancelled by a negative emitter differential resistance, −re, formed by a negative impedance circuit constructed of the third transistor pair 3, in which the bases thereof are connected to the corresponding collectors thereof, the gain G between the input and the output is given by the following equation.

$$G=I2/(Re/2+re-re) \; I1=(2/Re) \; I2/I1 \quad (4)$$

Thus, since there is no influence of the emitter differential resistance re, which is a non-linear element, an excellent linear characteristics can be accomplished.

Figure 10:
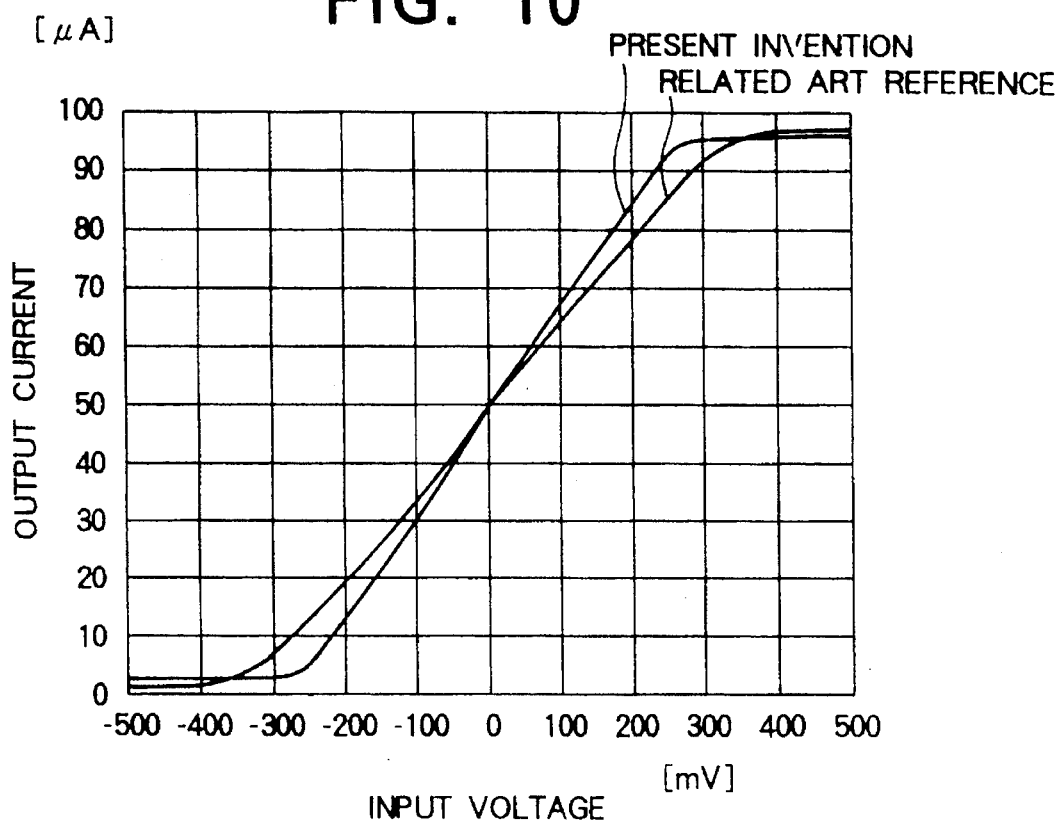
FIG. 10 is a graph showing input and output characteristics of DC transmission characteristics in the related art reference and the present invention.
Figure 11:
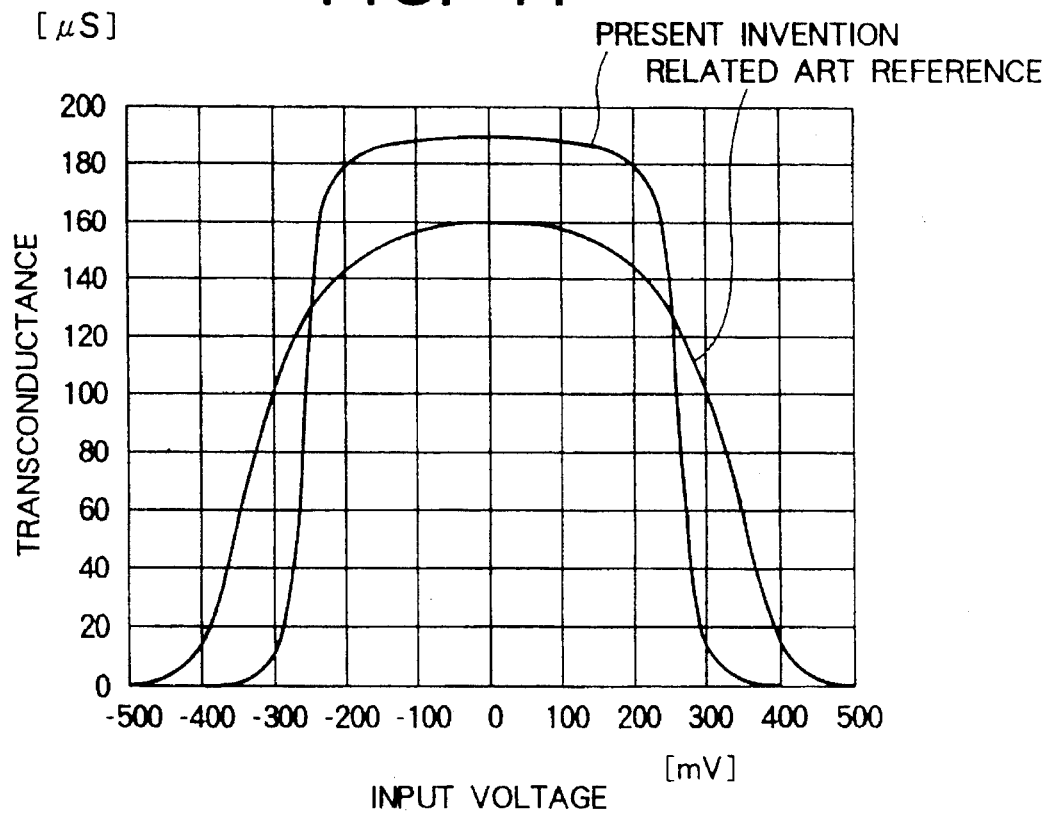
FIG. 11 is a graph showing a transconductance in which a current output shown in FIG. 10 is differentiated by an input.

FIG. 10 shows simulation results of DC transmission characteristics in the same conditions of the circuits shown in FIGS. 8 and 1. FIG. 11 shows a transinductance in which the current output shown in FIG. 10 is differentiated by the input. As is clear from FIG. 11, the transinductance of this embodiment is very flat in comparison with that of the related art reference. In other words, the linear characteristics of this embodiment are superior to those of the related art reference.

Figure 2:
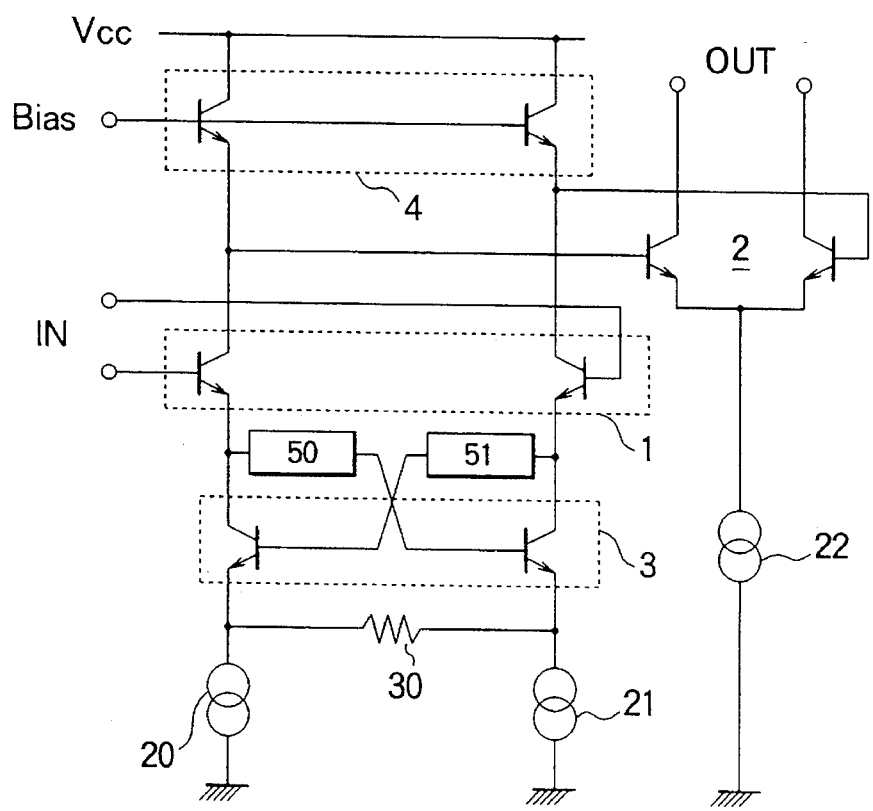
FIG. 2 is a circuit diagram for explaining a second embodiment of the present invention.

FIG. 2 is a circuit diagram for explaining a second embodiment that is a modification of the first embodiment shown in FIG. 1. The difference points between the second embodiment and the first embodiment are in that the diode pair 11 is substituted with a fourth transistor pair 4 in which bases are connected to a bias voltage source and that the bases of the third transistor pair 3 are connected to the corresponding collectors thereof through DC level shift means 50 and 51.

In the circuit shown in FIG. 1, the input level is limited where the transistors of the third transistor pair 3 are saturated. Thus, when the base-emitter voltage Vbe of the transistors is 0.7 V and the saturation voltage V C E sat is 0.2 V, the maximum input level becomes 2(Vbe–V C E sat)=1.0 Vpp. Thus, the circuit cannot handle the input level exceeding 1.0 Vpp.

On the other hand, according to the second embodiment, the DC level shift means 50 and 51 can increase the maximum input level at which the transistors of the third transistor pair 3 saturate. When the DC level is shifted for 0.7 V by the DC level shift means 50 and 51, the maximum input level increases for 2(Vbe+0.7–V C E sat)=2.4 Vpp. When the DC level shift means 50 and 51 are impedance means, frequency characteristics of the input signal source against impedance can be compensated. Thus, good frequency characteristics can be accomplished in a wide frequency range.

Figure 3:
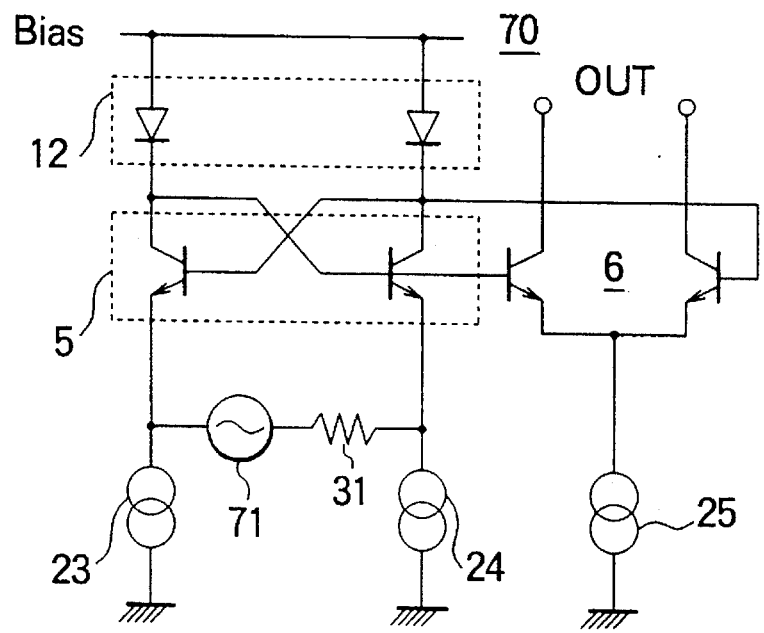
FIG. 3 is a circuit diagram showing a basic conception for explaining a third embodiment of the present invention.

FIG. 3 is a circuit diagram showing a basic conceptional construction for explaining a third embodiment of the present invention. In FIG. 3, bases of a fifth transistor pair 5 are connected to corresponding collectors thereof. Emitters of the fifth transistor pair 5 are connected to current sources 23 and 24. The emitters are connected through an input voltage means 71 and a resistor 31. A second diode pair 12 is connected between the collectors of the fifth transistor pair 5 and a bias voltage source. The cathodes of the second diode pair 12 are connected to bases of a sixth transistor pair 6. Emitters of the sixth transistor pair 6 are connected as a common emitter to a current source 25.

According to such a construction, since the impedance of the emitters of the fifth transistor pair 5 is almost zero, the emitter voltage is always constant. A signal that is input from an input voltage means 71 is converted into a current with good linear characteristics by the resistor 31. Since the resultant current becomes a bias current of the second diode pair 12, output currents with good linear characteristics are obtained from the collectors of the sixth transistor pair 6.

In addition to the advantages of the circuits shown in FIGS. 1 and 2, the circuit according to the third embodiment can be operated at a low voltage because of lesser devices disposed between the voltage source Vcc and the reference voltage.

Figure 4:
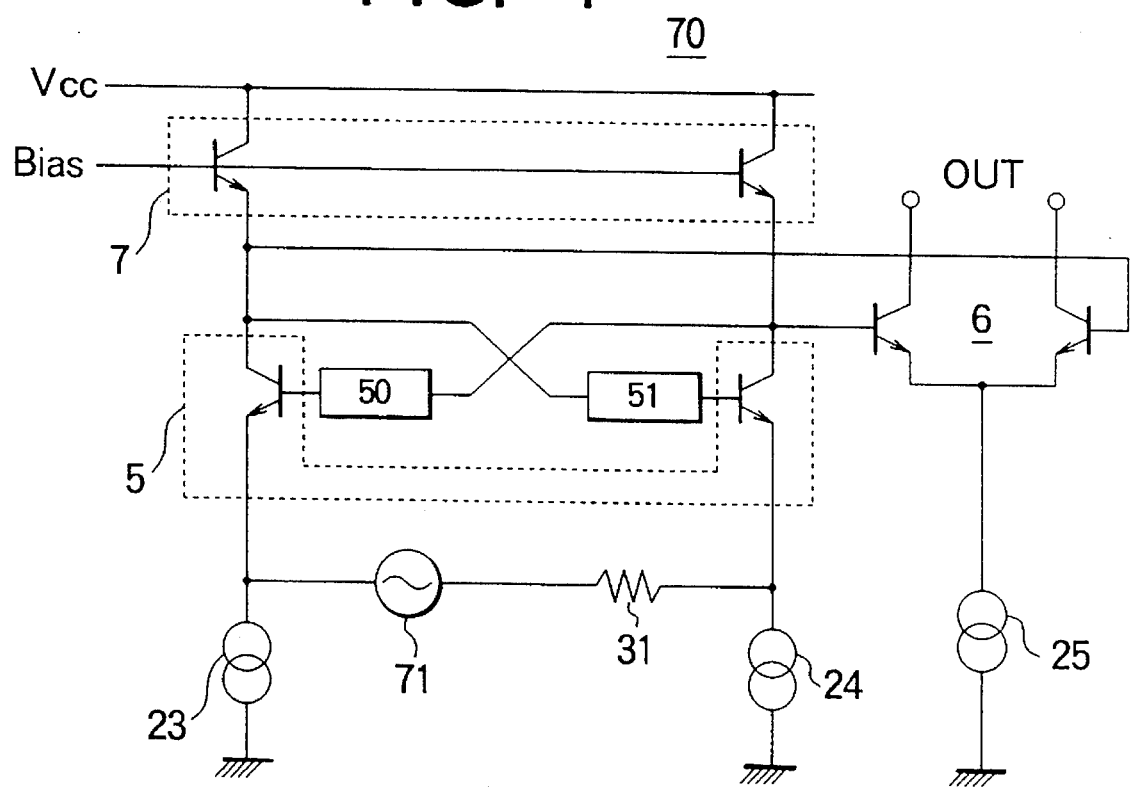
FIG. 4 is a circuit diagram for explaining a fourth embodiment of the present invention.

FIG. 4 is a circuit diagram for explaining a fourth embodiment of the present invention. The fourth embodiment is a modification of the third embodiment shown in FIG. 3. In the fourth embodiment, the second diode pair 12 shown in FIG. 3 is substituted with a seventh transistor pair 7 in which bases are biased. The bases of the fifth transistor pair 5 are connected to the corresponding collectors thereof through DC level shift means 50 and 51.

In such a construction, as with the second embodiment shown in FIG. 2, the saturation of the fifth transistor pair 5 can be improved. In addition, when the DC level shift means 50 and 51 are impedance means, the frequency characteristics can be also improved.

Figure 5:
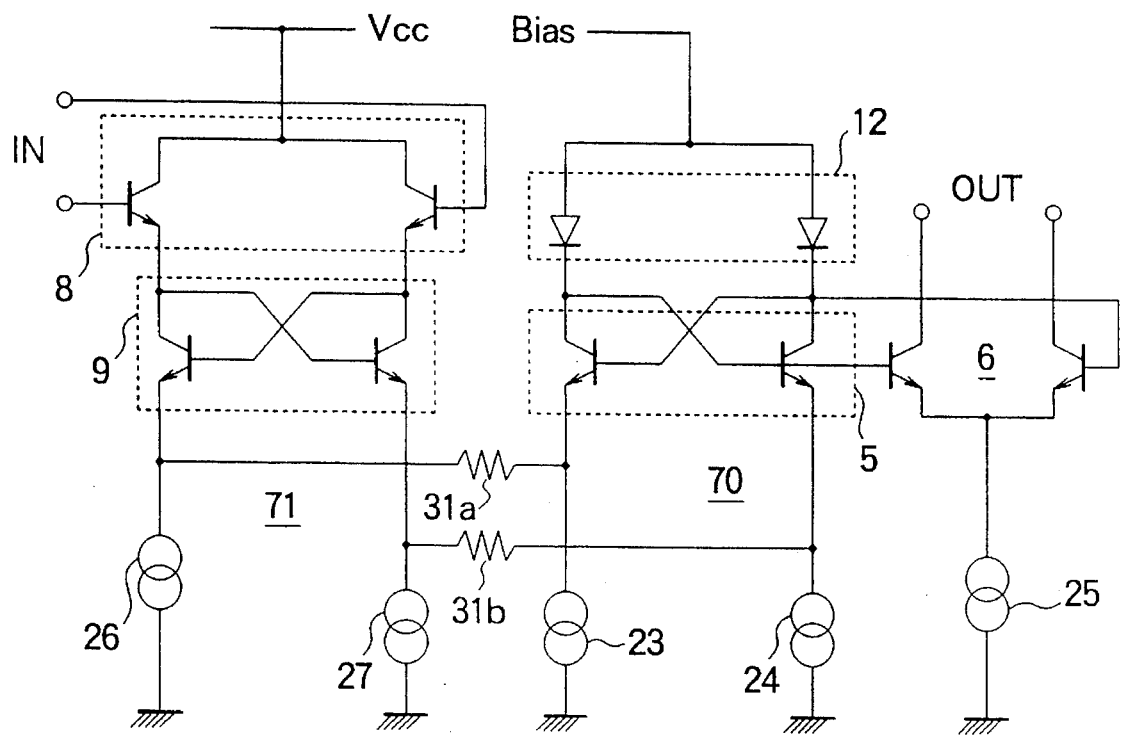
FIG. 5 is a more practical circuit diagram for explaining the circuit of FIG. 3.

FIG. 5 is a complete circuit diagram of the third embodiment including a practical circuit of an input voltage means 71. In FIG. 5, an input voltage means 71 is constructed of an eighth transistor pair 8 and a ninth transistor pair 9. Input signals are supplied to bases of the eighth transistor pair 8. The emitters of the eighth transistor pair 8 are connected to corresponding collectors of the ninth transistor pair 9. The collectors of the ninth transistor pair 9 are connected to corresponding bases thereof. The emitters of the ninth transistor pair 9 are connected to respective current sources 26 and 27. The emitters of the ninth transistor pair 9 are connected to the emitters of the fifth transistor pair 5 through resistors 31a and 31b, respectively, instead of the resistor 31.

According to the construction shown in FIG. 5, since the input voltage means 71 has lesser devices connected in series between the voltage source Vcc and the reference voltage, the circuit can be operated at a low voltage.

Figure 6:
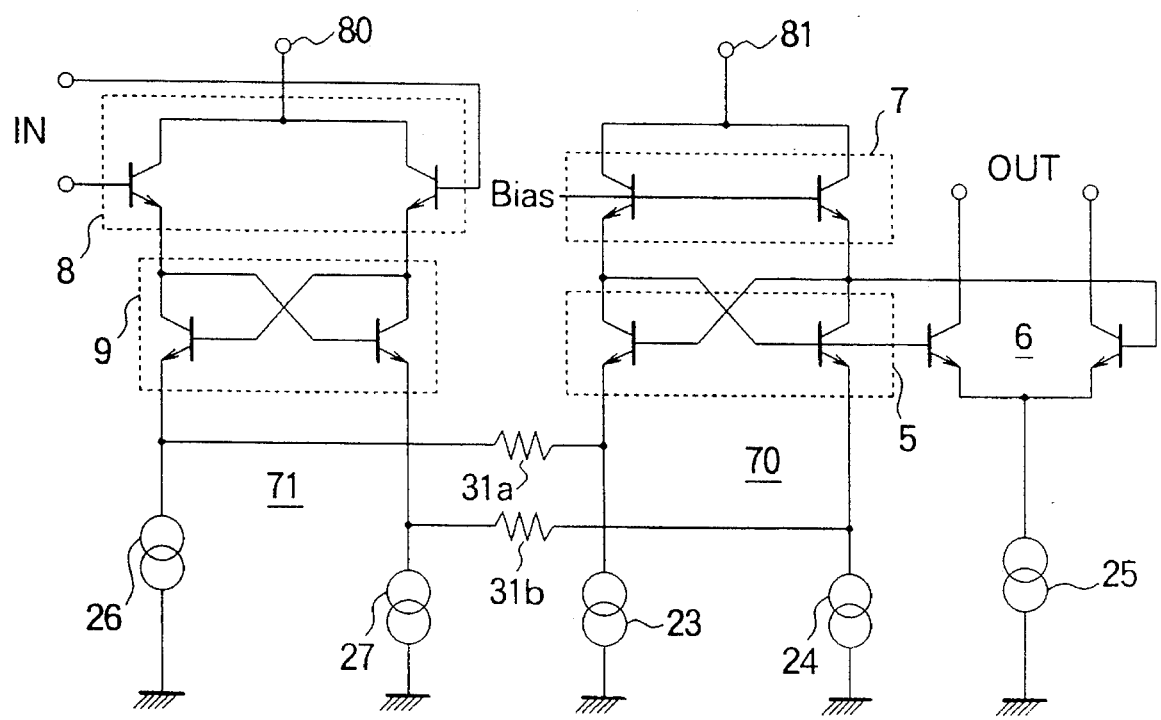
FIG. 6 is a more practical circuit diagram for explaining a modified circuit of FIG. 5.

FIG. 6 is a circuit diagram showing a modification of the circuit shown in FIG. 5.

The different point between the circuit shown in FIG. 6 and the circuit shown in FIG. 5 are in that the second diode pair 12 is substituted with the seventh transistor pair 7 in which the bases are biased and that the two collectors of the seventh transistor pair 7 and the two collectors of the eighth transistor pair 8 are connected as terminals 80 and 81, respectively. Thus, the circuit shown in FIG. 5 equivalently operates as one differential transistor pair as shown in FIG. 7.

Figure 7:
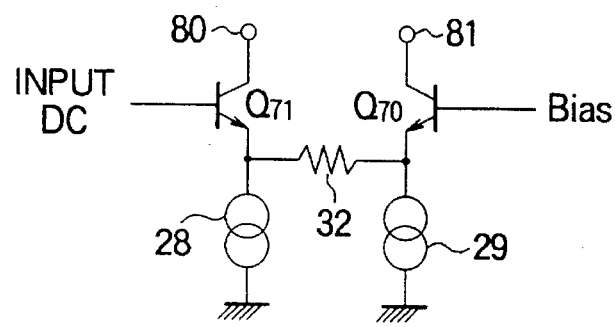
FIG. 7 is a circuit diagram showing an equivalent circuit of FIG. 6.

In FIG. 7, an average voltage of an input signal is applied to a base of a first equivalent transistor Q71. A bias voltage is applied to a base of a second equivalent transistor Q70. The emitters of the first equivalent transistor Q71 and the second equivalent transistor Q70 are connected through a resistor 32. Output currents are obtained from collector terminals 80 and 81 of the first equivalent transistor Q71 and the second equivalent transistor Q70.

In this case, the equivalent resistance of the resistor 32 is the composite resistance of parallel resistors 31a and 31b. The current value of the current source 28 is the sum of the current sources 26 and 27. The current value of the current source 29 is the sum of the current sources 23 and 24. Thus, as is clear from the equivalent circuit shown in FIG. 7, the circuit shown in FIG. 6 can process two signals.

As a bias means for the second diode pair 12, when an emitter voltage of for example a common base circuit is used, the composite current output of the two bias currents of the second diode pair 12 is obtained from the collector terminals of the common base circuit. Thus, this construction applies to the circuit shown in FIG. 5. However, a higher voltage for the common base circuit is required than the circuit shown in FIG. 6.

Thus, unless the average DC voltage and the bias voltage of input signals of the circuits shown in FIGS. 5 and 6 are precisely controlled, the bias current of the second diode pair 12 varies and thereby the gain also varies. On the other hand, in the construction shown in FIG. 5, when the bias voltage is used as a bias current and the current value is kept constant, the gain can be kept constant. In the case of the construction shown in FIG. 6, the bias voltage or the average DC voltage of the input signal is controlled so that the output current of the collector terminal 81 becomes constant.

It should be noted that the present invention is not limited to the above-described embodiments. Instead, various modifications are available. For example, as described in the embodiments, the diodes may be substituted with transistors. In other words, according to the present invention, PN junctions are required. In addition, according to the embodiments of the present invention, all the transistors are NPN transistors with high frequency characteristics. However, when the good frequency characteristics are not required, the NPN transistors may be substituted with PNP transistors. In addition, the resistors and current sources connected to the emitters are not limited to the construction of a so-called π type connection. Instead, the circuit may be constructed in a T type connection. Moreover, the resistors and current sources of the circuit are not always required. Instead, they can be removed when required.

In other words, when the emitter differential resistance is cancelled with a negative impedance circuit, the circuit can linearly operate. The characteristics for compression and expansion that the PN junction pair and the differential transistor pair provide can be used.

Although the present invention has been shown and described with respect to a best mode embodiment thereof, it should be understood by those skilled in the art that the foregoing and various other changes, omissions, and additions in the form and detail thereof may be made therein without departing from the spirit and scope of the present invention.

What is claimed is:

1. A variable gain amplifying circuit, comprising:
   a first transistor pair whose bases are connected to input terminals;
   A PN junction pair for conducting bias currents that are collector currents of said first transistor pair;
   a second transistor pair with a common emitter connection and bases connected to receive a voltage difference of said PN junction pair, the common emitter connection connected to a first current source;
   a third transistor pair whose collectors are connected to corresponding emitters of said first transistor pair, whose bases and collectors are cross-connected, and whose emitters are connected to second and third sources for supplying bias currents;
   a resistor connected between the emitters of said third transistor pair; and
   output terminals connected to collectors of said second transistor pair.

2. The variable gain amplifying circuit as set forth in claim 1, wherein the bases and the collectors of said third transistor pair are cross-connected through impedance means.

3. A variable gain amplifying circuit, comprising:
   a first transistor pair whose bases and collectors are cross-connected and whose emitters are connected to respective first current sources for supplying bias currents;
   a PN junction pair for conducting bias currents that are collector currents of said first transistor pair;
   a second transistor pair with a common emitter connection and bases connected to receive a voltage difference of said PN junction pair, the common emitter connection connected to a second current source;
   input voltage means,
   a resistor connected in series with said input voltage means between the emitters of said first transistor pair; and
   output terminals connected to collectors of said second transistor pair.

4. The variable gain amplifying circuit as set forth in claim 3, wherein said input voltage means includes a third transistor pair and a fourth transistor pair, the third transistor pair having bases connected to input terminals, and emitters connected to collectors of said fourth transistor pair, emitters of said fourth transistors being connected to respective third current sources for supplying bias currents.

5. The variable gain amplifying circuit as set forth in claim 4, wherein the bases and collectors of said first transistor pair are cross-connected through impedance means.

6. The variable gain amplifying circuit as set forth in claim 4, further comprising current composite means for compositing the bias currents of said PN junction pair and the collector currents of said third transistor pair.

7. The variable gain amplifying circuit as set forth in claim 1, wherein the bases and collectors of said third transistor pair are cross-connected through DC level shift means.

8. The variable gain amplifying circuit as set forth in claim 4, wherein the bases and collectors of said first transistor pair are cross-connected through DC level shift means.

9. The variable gain amplifying circuit as set forth in claim 4, wherein bases of said fourth transistor pair are cross-connected to the collectors of said fourth transistor pair through impedance means.

10. The variable gain amplifying circuit as set forth in claim 4, wherein bases of said fourth transistor pair are cross-connected to the collectors of said fourth transistor pair through DC level shift means.

11. A variable gain amplifying circuit, comprising:
  a first transistor pair whose bases are connected to input terminals;
  a PN junction pair for conducting bias currents that are collector currents of said first transistor pair;
  a second transistor pair with a common emitter connection and bases connected to receive voltage difference of said PN junction pair, the common emitter connection connected to a first current source;
  a third transistor pair whose collectors are connected to corresponding emitters of said first transistor pair, whose bases and collectors are coupled by cross-connections and whose emitters are connected to second and third sources for supplying bias currents;
  impedance means included in the cross-connections of the bases and collectors of said third transistor pair;
  a resistor connected between the emitters of said third transistor pair; and
  output terminals connected to collectors of said second transistor pair.

12. A variable gain amplifying circuit, comprising:
  a first transistor pair having bases and collectors coupled by cross-connections and having emitters connected to respective first current sources for supplying bias currents;
  a PN junction pair for conducting bias currents that are collector currents of said first transistor pair;
  a second transistor pair having a common emitter connection and bases connected to receive input of a voltage difference of said PN junction pair, the common emitter connection connected to a second current source;
  input voltage means;
  impedance means included in the cross-connections of the bases and collectors of said first transistor pair;
  resistance means connected with said input voltage means between the emitters of said first transistor pair; and
  output terminals connected to collectors of said second transistor pair.

13. The variable gain amplifying circuit as set forth in claim 12, wherein said input voltage means includes a third transistor pair and an fourth transistor pair, the third transistor pair having bases connected to input terminals and emitters connected to collectors of said fourth transistor pair, emitters of said fourth transistor pair being connected to respective third current sources for supplying bias currents.

14. The variable gain amplifying circuit as set forth in claim 13, further comprising current composite means for compositing the bias currents of said PN junction pair and collector currents of said third transistor pair.

* * * * *